(12) United States Patent
Leemans et al.

(10) Patent No.: US 9,162,637 B2
(45) Date of Patent: Oct. 20, 2015

(54) METHOD FOR PACKAGING AND CONNECTING ULTRACAPACITORS FOR ENERGY STORAGE PURPOSES

(75) Inventors: Filip Leemans, Dessel (BE); Johan De Smet, Heppen-Leopoldsburg (BE); Dominique Weyen, Lommel (BE)

(73) Assignee: VITO NV, Mol (BE)

( * ) Notice: Subject to any disclaimer, the term of this patent is extended or adjusted under 35 U.S.C. 154(b) by 503 days.

(21) Appl. No.: 13/704,170

(22) PCT Filed: Jun. 30, 2011

(86) PCT No.: PCT/EP2011/061052
§ 371 (c)(1),
(2), (4) Date: Dec. 13, 2012

(87) PCT Pub. No.: WO2012/007290
PCT Pub. Date: Jan. 19, 2012

(65) Prior Publication Data
US 2013/0082520 A1   Apr. 4, 2013

(30) Foreign Application Priority Data

Jul. 14, 2010   (DE) ..................... 20 2010 010 231 U
Jul. 14, 2010   (EP) ..................... 10169572

(51) Int. Cl.
*B60R 16/03*   (2006.01)
*H01G 4/38*   (2006.01)
*H01G 11/10*   (2013.01)
(Continued)

(52) U.S. Cl.
CPC ............... *B60R 16/03* (2013.01); *H01G 2/106* (2013.01); *H01G 4/38* (2013.01); *H01G 11/10* (2013.01); *H01G 11/72* (2013.01); *H01G 11/74* (2013.01); *H01G 11/76* (2013.01); *H01G 11/82* (2013.01);
(Continued)

(58) Field of Classification Search
USPC ......................................................... 307/150
See application file for complete search history.

(56) References Cited

U.S. PATENT DOCUMENTS 2,824,264 A   9/1956   Anastopoulos
6,409,545 B1 *   6/2002   Vetter et al. .............. 439/620.24
(Continued)

FOREIGN PATENT DOCUMENTS

DE   202010010231 U1   1/2011
EP   0817288 A1   1/1998
(Continued)

OTHER PUBLICATIONS

European Patent Office, Communication pursuant to Article 94(3) EPC, dated Jul. 4, 2013, 5 pages.
(Continued)

*Primary Examiner* — Ronald W Leja
(74) *Attorney, Agent, or Firm* — Finnegan, Henderson, Farabow, Garrett & Dunner, L.L.P.

(57) ABSTRACT

An ultracapacitor energy storage system and in particular a system for packaging and connecting ultracapacitors (15) for energy storage purposes is described which is applicable in automotive and stationary applications. The ultracapacitors (15) in the system can be in series or parallel or a combination of both. A controller, relays, voltage monitoring and isolation fault detection are used to regulate the system. The mechanical construction of frame and different pluggable modules (2 and 7) lead to an easy in- and de-installation of the different parts. The different constructions are designed with a safe handling by the operator in mind.

11 Claims, 6 Drawing Sheets

(51) Int. Cl.
*H01G 11/72* (2013.01)
*H01G 11/76* (2013.01)
*H01G 11/82* (2013.01)
*H01G 2/10* (2006.01)
*H05K 7/00* (2006.01)
*H05K 7/20* (2006.01)
*H01G 11/74* (2013.01)

(52) U.S. Cl.
CPC .............. *H05K 7/00* (2013.01); *H05K 7/20854* (2013.01); *Y02E 60/13* (2013.01)

(56) References Cited

U.S. PATENT DOCUMENTS

| | | |
|---|---|---|
| 2006/0262482 A1 | 11/2006 | Yamamoto et al. |
| 2007/0002518 A1 | 1/2007 | Wilk et al. |
| 2007/0067119 A1* | 3/2007 | Loewen et al. .................. 702/57 |
| 2010/0090663 A1* | 4/2010 | Pappas et al. .................. 320/166 |
| 2010/0093223 A1* | 4/2010 | Pappas et al. .................. 439/660 |
| 2010/0134940 A1 | 6/2010 | Nguyen et al. |
| 2013/0082520 A1* | 4/2013 | Leemans et al. ............... 307/9.1 |

FOREIGN PATENT DOCUMENTS

| | | |
|---|---|---|
| FR | 84 685 | 3/1965 |
| FR | 2 492 577 A1 | 4/1982 |

OTHER PUBLICATIONS

International Search Report from the European Patent Office in PCT/EP2011/061052, mailed on Sep. 21, 2011 (10 pages).

Extended Search Report from the European Patent Office in PCT/EP2011/061052, mailed on Dec. 9, 2010 (5 pages).

* cited by examiner

METHOD FOR PACKAGING AND CONNECTING ULTRACAPACITORS FOR ENERGY STORAGE PURPOSES

This application is a national stage filing under 35 U.S.C. §371 of International Application No. PCT/EP2011/061052 filed on Jun. 30, 2011, which claims priority to German Application No. 20 2010 010 231.6, filed on Jul. 14, 2010 and European Application No. 10169572.4, filed on Jul. 14, 2010, all of which are incorporated herein by reference.

The present application relates to capacitor banks especially ultracapacitor banks, to electrical storage means including such a capacitor bank, and to vehicles including the electrical storage means as well as to methods of making and using capacitor banks especially ultracapacitor banks.

TECHNICAL BACKGROUND

Batteries are commonly used in a wide variety of applications, for example as an energy buffer in hybrid vehicles and standalone applications. The disadvantage of batteries is their short life expectancy and the low power density. One cause of such problems is the chemical reaction which lies at the heart of their mode of operation. These characteristics reduce performance and payback time in industrial and automotive applications. Ultracapacitors are low voltage capacitors with a high capacity. Their energy density is the major difference with a normal capacitor. Compared to batteries the power density and life expectancy of ultracapacitors is greatly improved. Typical numbers for these characteristics are one million cycles and a power density of 5900 W/kg for a capacity of 3000 Farad. The higher power density creates an ideal situation for absorbing peak power. The peaks that occur when braking or accelerating a hybrid vehicle will result in a lower life time for a battery, but will be an ideal application for ultracapacitors. For the vehicle this will result in a lower fuel consumption. Combination with a long life expectancy gives a better solution compared to batteries in some applications.

Whether the ultracapacitors are used on an automotive application or in an industrial environment, they always need an appropriate enclosure.

U.S. 2007/0002518 A1 (Wilk et al.) is directed to an ultracapacitor high-energy storage pack suitable for high-voltage, high-power applications of electric and hybrid-electric vehicle propulsion systems, fixed site high-power load averaging, and high-power impulse requirements. The pack is housed in an aluminum box enclosure with a detachable access lid. The inside of the box has a thick anti corrosion, electrically insulating coating. The box has holes cut out for the mounting of cooling fans, air intakes, and electrical connections. Mounted to the interior of the box are aluminum guide support strips for three plastic crate support plates. The first two plastic crate plates structurally support and separate the ultracapacitors to provide space for cooling airflow along the direction of the plates. The third crate plate supports and positions the cans by the threaded end terminals that are bolted to the plate. Bus bars are fastened to the inside of the third crate plate to provide connections between adjacent rows of ultracapacitors. The cans, which are arranged in rows of three, are electrically and structurally connected together with threaded studs and bus bars.

FR 84 685 E (Applic Logiques de l'Electroni) is directed to matrix systems containing semiconductor diodes or rectifier matrixes comprising a variable number of rigid plates which are in parallel spaced relation on both sides, and removable devices permitting obtaining connections between selected points on said networks.

U.S. 2010/0134940 A1 (Nguyen et al.) is directed to an energy storage cell pack cradle assembly for holding multiple rows of energy storage cells oriented along a dominant axis of vibration. The cell pack cradle assembly includes a first cradle member including a plurality of energy storage cell body supporting structures including respective holes; a second cradle member including a plurality of energy storage cell body supporting structures including respective holes; and one or more fasteners connecting the first cradle member and the second cradle member together. The energy storage cell body supporting structures are configured to structurally support the energy storage cells, with the energy storage cells oriented along a dominant axis of vibration, by energy storage cell bodies of the energy storage cells with respective electrically conductive terminals extending through the respective holes without structural support of the electrically conductive terminals by the cradle members.

FR 2 492 577 A1 (Alsthom Atlantique) is directed to a resin coated dry 3-phase condenser.

U.S. Pat. No. 2,824,264 A (Anastopoulos) is directed to an improved electrolytic capacitor plug-in rack and support assemblies, wherein plural circuit couplings and compact physical mountings may be effectuated rapidly and effectively.

SUMMARY OF THE INVENTION

The object of the present invention is to provide an ultracapacitor energy storage system and in particular a system for packaging and connecting ultracapacitors for energy storage purposes which is applicable in automotive and stationary applications. The ultracapacitors in the system can be in series or parallel or a combination of both. A controller, relays, voltage monitoring and isolation fault detection are used to regulate the system. The mechanical construction of frame and different pluggable modules lead to an easy in and de-installation of the different parts. The different constructions are designed with a safe handling by the operator in mind.

The present invention provides an assembly of ultracapacitor modules with a coupling system for the plurality of ultracapacitor modules, comprising: a plurality of ultracapacitor modules, each module comprising a plurality of ultracapacitors in a housing, a connection module to connect together the plurality of ultracapacitor modules with each other and a frame to keep the modules mechanically together, the ultracapacitor modules being adapted for pluggable connection with the connection module and for slidable insertion in the frame.

A connection module has connections for power and signals between the ultracapacitor modules. In particular the ultracapcitor module includes a connector that slides into a counterpart connector located on the connection module for connection of the power and signals between the ultracapacitor modules.

Preferably, each ultracapacitor module has a housing and a heat sink is provided on the housing with means for airflow over the heat sink. Optionally, an air-guiding plate is provided on the side of the heat sink remote from the housing. For example, the air-guiding plate can be adapted for sliding into the frame or is mounted onto an ultracapacitor module.

To obtain maximum voltage, the ultracapacitors in an ultracapacitor module can be connected in series. The ultracapacitors in an ultracapacitor module are preferably connected by busbars. To provide good thermal cooling, the busbars are preferably in conductive thermal contact (but not in electrical contact) with outer material of the housing in which the ultracapacitors are located.

Preferably a controller is provided, the controller being adapted for voltage monitoring and/or isolation fault detection.

The present invention also provides a vehicle having an energy storage system including a coupling system for the plurality of ultracapacitor modules according to any of the embodiments of the present invention.

DESCRIPTION OF THE PREFERRED EMBODIMENTS

Figure 1:
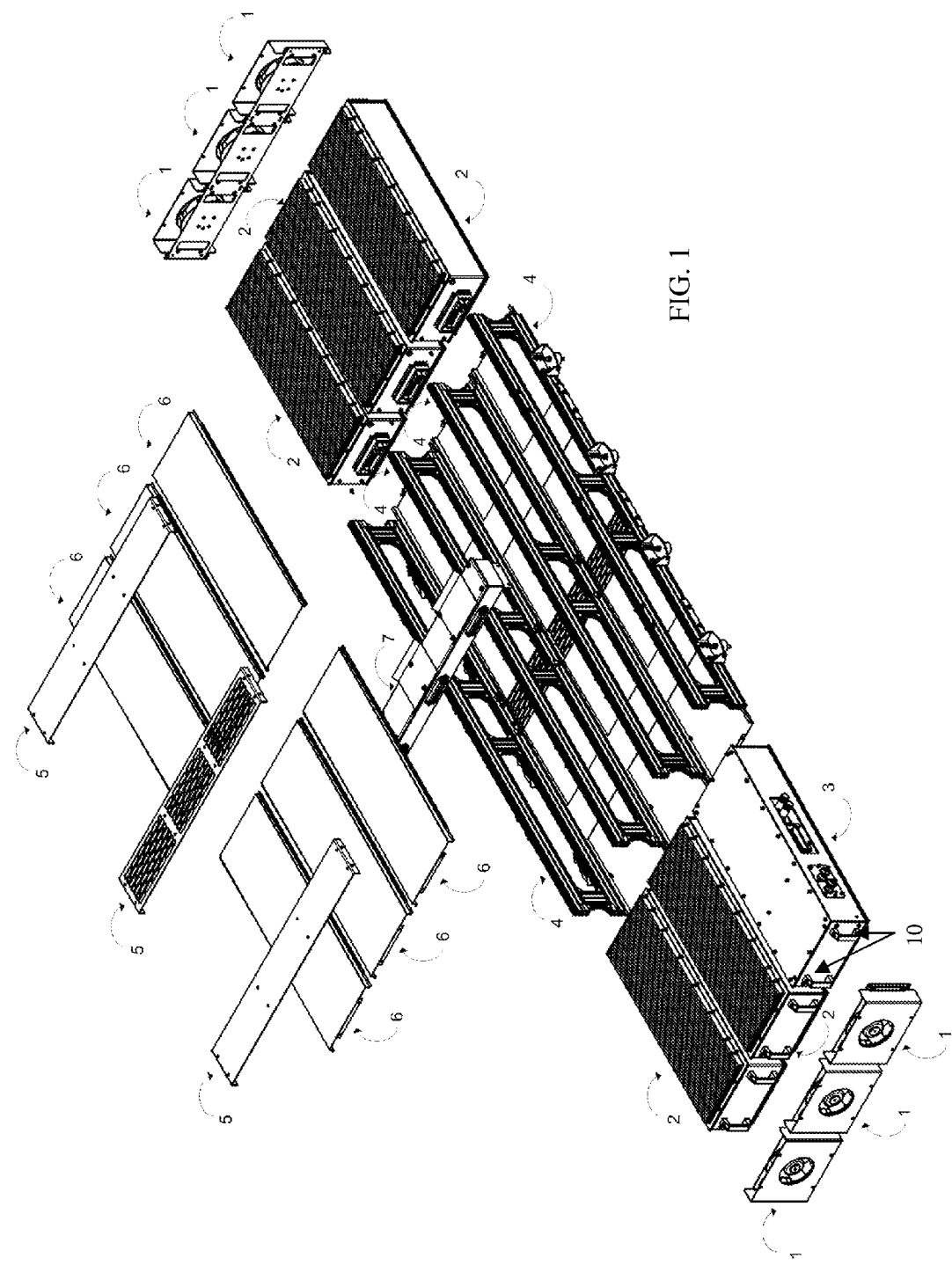
FIG. 1 illustrates an ultracapacitor energy storage system according to an embodiment of the present invention.

The present invention will be described with respect to particular embodiments and with reference to certain drawings but the invention is not limited thereto but only by the claims. The drawings described are only schematic and are non-limiting. In the drawings, the site of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The present invention provides a pluggable high energy system that is suitable for most environments. Also the system is secure and safe in that meets security requirements. Such a system may find use in, for example, the automotive industry to provide a water-sealed, reinforced, and vibration resistant system. The ability to release a lot of power in a short amount of time has its influence on security. Further additions to the system include safety precautions against isolation faults and short circuit current protection.

A water-sealed, reinforced, and vibration resistant system in accordance with embodiments of the present invention may comprise an assembly of different ultracapacitor modules 2 as part of a coupling system to connect together the modules. A module may be protected to a degrees of impermeability of IP65, IP66, IP68 and IPX9-k, according to DIN EN 60529 and DIN 40 050 Teil 9. Such an ultracapacitor module 2 comprises a plurality of ultracapacitors. Embodiments of the present invention include both capacitors having the screw and/or welded type connections to the electrodes. These capacitors can be connected in series, in parallel or in a combination of series and parallel. The configuration depends on the required voltage and capacity and can be adapted to any level.

Figure 5:
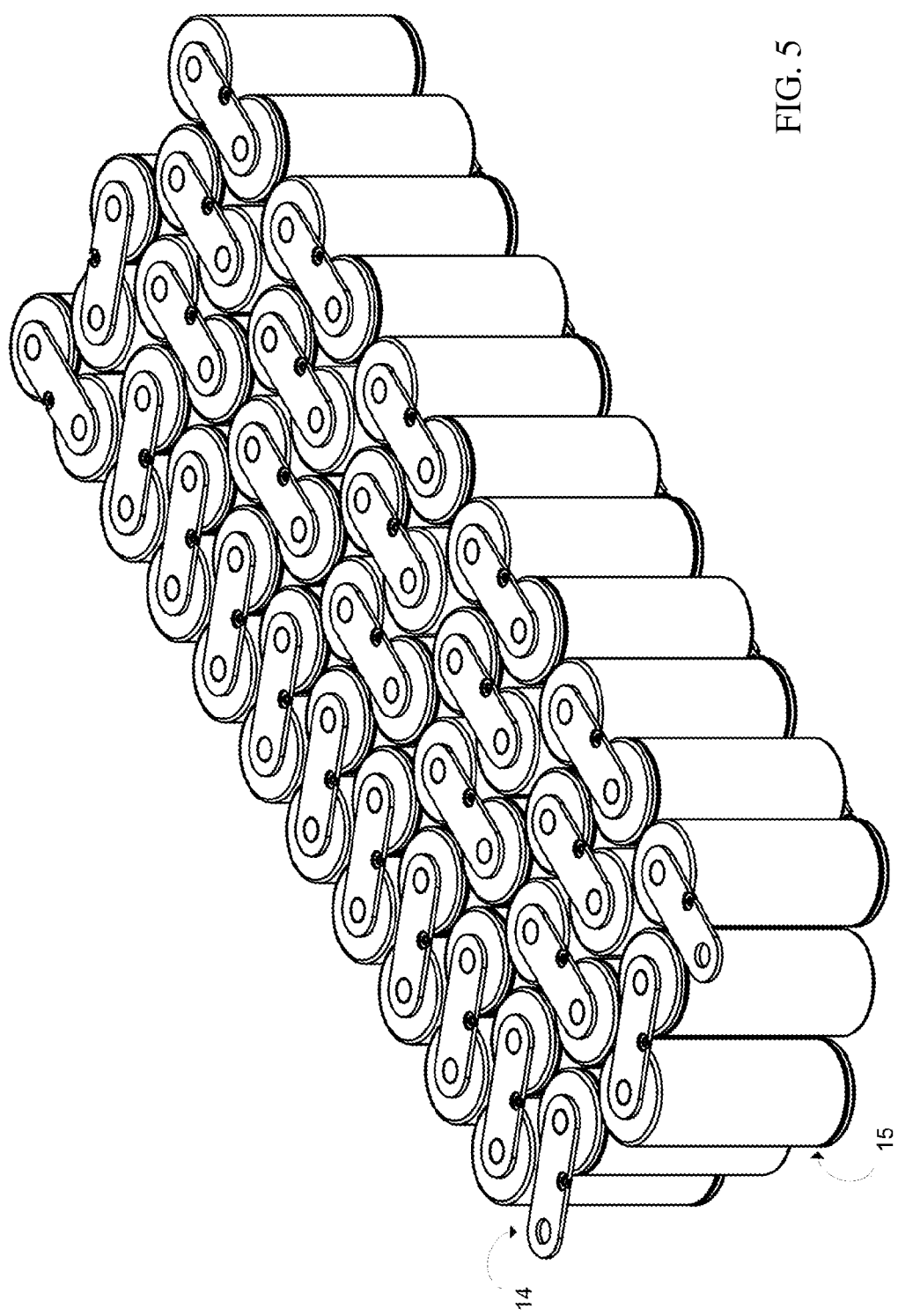
FIG. 5 illustrates an assembly of ultracapacitors according to an embodiment of the present invention.

To save space the ultracapacitors 15 can be positioned in a close-packed triangle-form (e.g. FIG. 5) in one embodiment, but a square-form (matrix) may also be used.

Connecting a plurality of at least one of the electrodes of the ultracapacitors 15 together is done by busbars 14. The busbar material must be capable of good thermal conduction of heat (transcalent) as well as being electrically conductive, for example copper or aluminum or any of their alloys can be used. The shape of the busbar 14 can be an ellipse or a rectangle with the corners cut-off. This shape allows a large area of the section of the busbar 14 without allowing two busbars coming to close to each other. On busbar 14 a hole with a depth less than the height of the busbar can be foreseen to connect a wire. When quick connections are desired, a rivet can be used. Because of this hole, the top surface of busbar 14 stays flat. Bolting the wire to it can also be done. The purpose of this wire is to bring the voltages of each ultracapacitor 15 individually to an electronics unit such as a printed circuit board. Some of the functions these electronics can have are: balancing, overvoltage protection, and a safety discharge until empty.

To keep the ultracapacitors 15 together, one or more plastic plates, preferably insulating plates with holes in can be used. An example of such a plastic material is polyacetal (POM), but other mechanically strong and temperature resistant materials are also possible. This way the combination of ultracapacitors 15, busbars 14 and plastic plate form a stiff entity.

Figure 6:
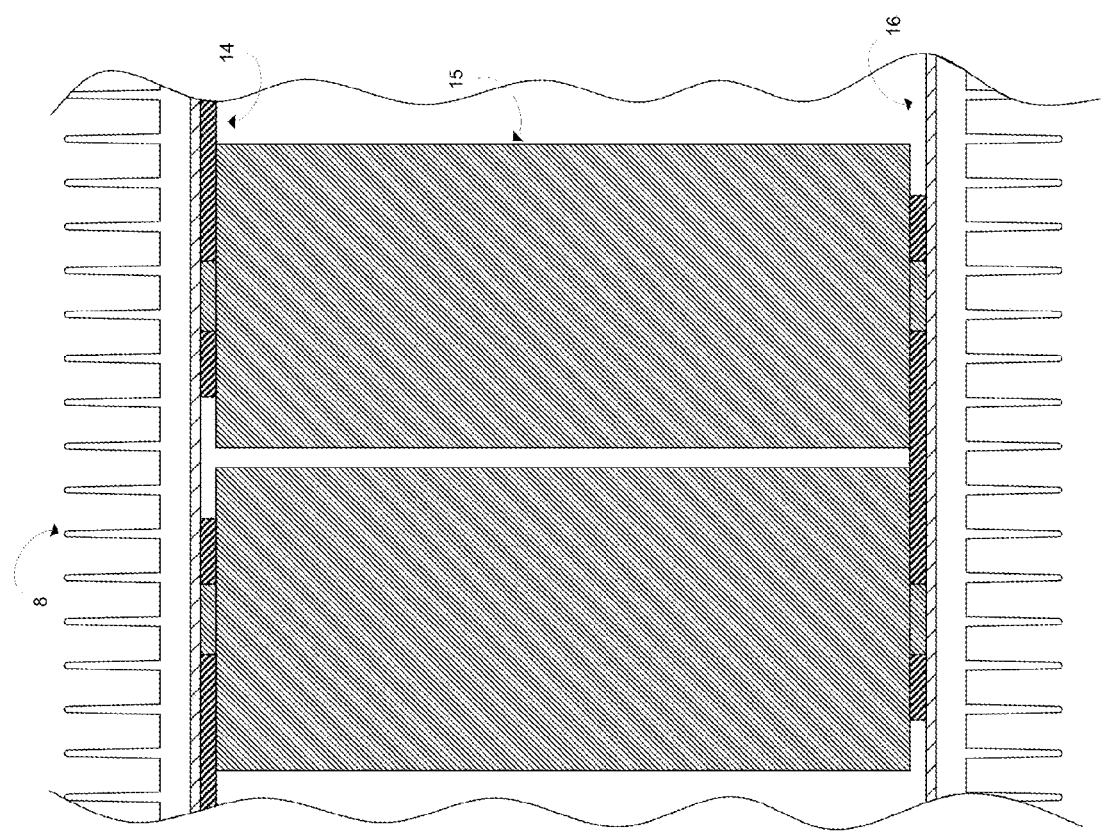
FIG. 6 shows a section through an ultracapacitor module according to an embodiment of the present invention.

The capacitors are located in a housing, e.g. in the form of a box. The busbars 14 are positioned is such a way that they preferably come in thermal (but not electrical) contact, especially conductive thermal contact with the outer construction of the box, as shown for example in FIG. 6. This conductive thermal contact will allow conduction of the developed heat from the ultracapacitors directly to the outside of the module 2 with better cooling as a result. To electrically isolate the module, an electrical isolation, and thermally conductive (transcalent) material 16 is preferably used between the busbars 14 and the modules outer material 8.

Figure 4:
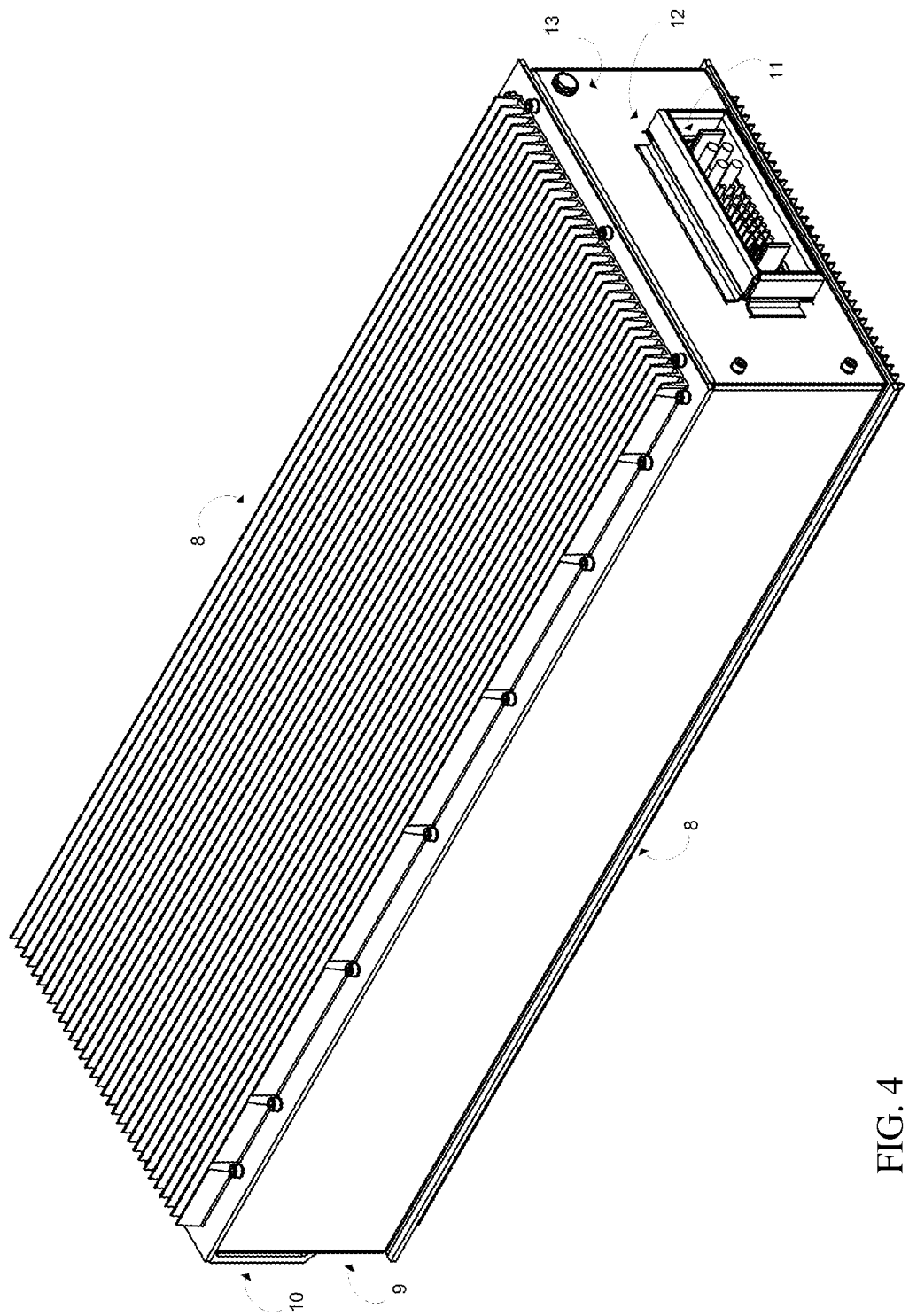
FIG. 4 illustrates an ultracapacitor module according to an embodiment of the present invention.

The outer side of the housing of an ultracapacitor module FIG. 4 is, for example a rectangular box comprising plates 9 which can be folded, welded together, screwed together or a combination of these. On the plates or integral with them are located heat sinks, e.g. finned heat sinks. The plates 9 can be generally rectangular and it is preferred if the upper and lower surfaces are larger than the side or end surfaces. This provides better heat conduction away from the capacitors in each module. The housing is water-sealed, e.g. by welding or by application of sealants. The material is preferably a metal such as aluminum or other low weight material. The plates 9 that are in thermal contact the busbar 14, can in an alternative embodiment be replaced by heat sinks 8 to allow a better heat conduction to the environment.

One end of the box is equipped with a connector 11. This connector can include pins for power connection and for control signals such as temperature, voltage and control signals. A current loop can also be included. The system uses a connector 11 which can adjust its position itself when connecting to its counterpart. The "Combitac" of the company "Multi contact" is such a connector. On the opposite end of the box are handles 10. The reason to position the connector and bandies on different sides of the module is to maximize the distance between the place where an individual touches the module (the handles) and the power connection (the connector). It creates a safer way of handling a charged module. Waterproof sealing around the connector 12 and between the different parts of the outer box ensures a water-tight entity. A pressure compensation element 13 provides an equal pressure inside and outside the module. This to compensate the pressure rising caused by a temperature changes (rising/falling) of the working ultracapacitor system. Pressure compensation elements serve for the aeration and de-aeration of components, especially of enclosures. This prevents damage to built-in components caused by condensation that occurs because of variations in temperature/pressure peaks. Such a pressure compensation element can allow a high air flow rate combined with high water retention capacity. The internal pressure of the closed housing is adapted to the ambient pressure, and at the same time, water penetration is prevented. A membrane can be integrated into the pressure compensation element, which is permeable to air on both sides and permeable to water from only the side towards the inner of the housing. This means that air is free to flow from inside the module to the outside or from the outside to the inside. Water can only flow from the inside to the outside. This way water in the module can be removed automatically. Hence the housing can have a pressure compensation element which is mounted on the module for equalizing the pressure inside an outside while draining water to the outside.

In a less preferred embodiment an air cushion can be located in each water sealed module which assists in equalising the pressure.

Figure 2:
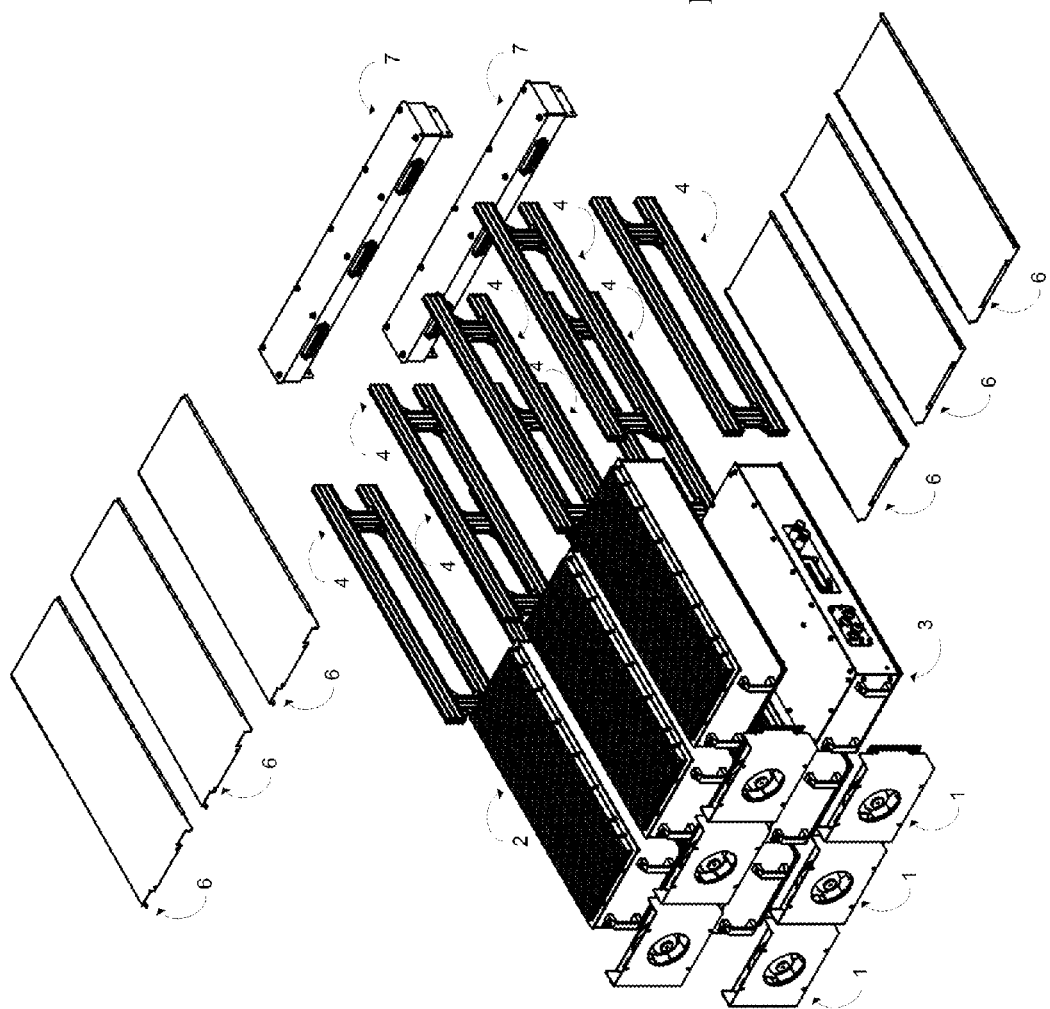
FIG. 2 illustrates a further ultracapacitor energy storage system according to an embodiment of the present invention.
Figure 3:
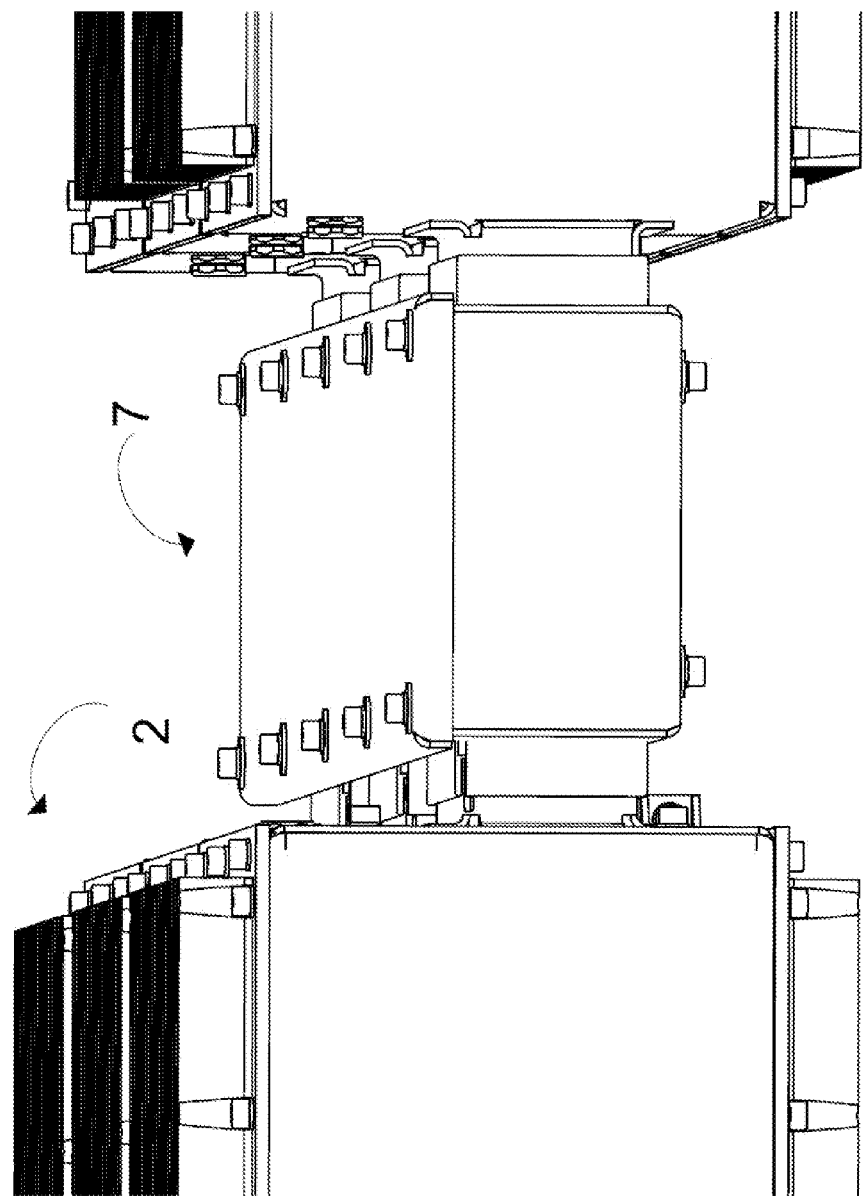
FIG. 3 illustrates a connection module according to an embodiment of the present invention.

A water-sealed, reinforced and vibration resistant system according to embodiments of the present invention, e.g. as shown in FIG. 1 and FIG. 2 comprises an assembly of a plurality of ultracapacitor modules 2 in a coupling system that includes a connection module 7 to combine the different ultracapacitor modules and a frame 4 to keep the modules mechanically together. The frame 4 is adapted to hold and secure ultracapacitor modules 2 and at least one connection module 7. The use of a plurality of ultracapacitor modules 2 has the advantage that the weight of one module is still permissible to be carried by a single individual. The fact that the total voltage of the whole system is divided by a certain number, depending on the number of modules, provides that one module has a lower and thus safer voltage level.

Preferred embodiments of the present invention involve a pluggable system of these ultracapacitor modules 2, e.g. slidable into the frame 4 and pluggable into one or more connector modules 7. The fact that the modules 2 are pluggable has several advantages. One is easy installation and replacement of the modules. A second advantage is that taking one ultracapacitor module out of its frame will bring the total voltage to a lower level so that working on a loaded system will be safer. It also has the advantage of interrupting the high power loop. An open loop is again a safer situation.

Two or more ultracapacitor modules 2 can be slid into a frame 4. This in combination with the connection modules makes the system pluggable. The number of ultracapacitor modules 2 can be selected as desired and depends on the level of voltage and capacity that is required. FIG. 1 and FIG. 2 give an example. On the drawings the end of each module 2 with the connector 11 is slid in first and the end with the handles 10 is the outer side. Means for locating the modules 2 into guides such as rails on the frames 4, are provided e.g. one or more protrusions can be formed on the ultracapacitor modules 2 which engage with, and run in guides such as rails on the frames. In this way the means for locating, such as the protrusions, slide into a guide, e.g. a rail on frame 4. Other means for sliding include providing frame 4 with a means for locating such as protrusions and the ultracapacitor modules 2 carry the guide or rail. As examples, either or both protrusions and guides can be made of aluminum, Teflon (PTFE), erthalon or another easily slidable (low friction) material. A mechanical construction of guides is also possible, e.g. a rail system.

The frame 4 is preferably made of a metal such as aluminum or another mechanically strong material. It can comprise different profiles. The profiles are attached to each other by a first fastening system, e.g. a screw combined with corner connectors or they are welded. Onto these profiles, reinforcement-profiles 5 are attached. These give the frame 4 its stiff construction.

The ultracapacitor module 2 is connected to the frame with a second fastening system such as screws or a quick-connection system such as clips. The purpose is that it takes less effort for an individual to install the ultracapacitor modules 2 in the frame.

When installing the ultracapacitor modules 2, the connector 11 of these modules slides into its counterpart. All these counterparts are located on the connection module 7. The primary goal of connection module 7 is the connection of power and signals between the different ultracapacitor modules. These connections can be made with cables or with busbars. The signal connections can include a current loop to detect unplugged boxes, signals from the temperature elements and voltages. The power connections can be chosen to connect the ultracapacitor modules in series, in parallel or in a combination of both. The connection module 7 is used as a reinforcement of the structure of frame 4.

When operated, the ultracapacitor modules 2 can produce heat. Passive cooling of the modules 2 is only acceptable at low current applications. When higher currents are required, e.g. hybrid vehicles, active cooling is preferable. Active cooling can be performed by fans and/or water cooling. The example systems in FIG. 1 and FIG. 2 use air cooling such as by fans 1. The fans are attached to frame 4 or directly onto the ultracapacitor module 2. Preferably the fans are located on the end of each module 2 that has the handles 10, i.e. the end remote from the connection module 7. Preferably the modules 2 are provided with heat sinks such as finned heat sinks on the upper and/or lower surfaces of each module 2. These fans 1 blow an airflow over the heat sinks 8 of the ultracapacitor modules 2. Above and/or below the module, air-guiding plates 6 are preferably present. These plates 6 can be slid into the frame 4 or can be mounted onto the ultracapacitor module 2. They keep the airflow close to the heat sink 8, e.g. mainly in between and around the fins of the heat sinks. Because of the limited space between the heat sink 8 and the plates 6, the air is forced to flow between the fins of heat sink 8. In the example system of FIG. 1 and FIG. 2, the fans 1 take in air from the outer side of the frame 4. The out stream is located at the connection modules 7.

To control and monitor the working of the ultracapacitor system, an electronic controller is provided. Relays or other switches can be used to switch the power connections on or off, both on the positive and negative cable. Additionally a pre-charge relay and pre-charge resistors can be provided. An electronic isolation detection system can be used to monitor the system for isolation faults. Temperature sensors can be provided to monitor the temperature on different places in the ultracapacitor modules 2. A fuse can be used to protect against high currents. A current sensor can be provided for measuring the current flowing in the system. The voltage of the system can be measured using sensors at one or more places. One place is before the fuse and a second is after. This means that the working of the fuse can be measured by comparing the two voltages. Hardware is foreseen to control the fans 1 in speed. All the electronics can be placed in a different module 3 that slide into the frame like an ultracapacitor module. Another possibility is placing the electronics into the connection module 7.

The system is designed to operate as a stand alone system, i.e. independently from an exterior system. However the possibility is foreseen that it can be controlled by an exterior system. The control messages can be sent over a CAN-bus for example.

Power connections from an exterior system can be made with cable lugs. The signal connections can be made with suitable connectors. The place where these connections enter the ultracapacitor system can be either the electronics module 3 or the connections module 7.

A water-sealed, reinforced, and vibration resistant system in accordance with embodiments of the present invention can be mounted on a vehicle such as an aircraft, a boat, an automobile, a bus, a truck, a milk float or any other electric vehicle to provide an electrical energy supply. For example it can be an emergency energy supply or it may be a primary energy supply for the vehicle. Alternatively, a water-sealed, reinforced, and vibration resistant system in accordance with embodiments of the present invention can be mounted on a stationary electrically powered device.

The invention claimed is:

1. A coupling system for a plurality of ultracapacitor modules, comprising:
   a plurality of ultracapacitor modules, each module comprising a plurality of ultracapacitors in a housing,
   a connection module adapted to electrically connect the ultracapacitor modules with each other, and
   a frame to keep the ultracapacitor modules and the connection module mechanically together,
   the ultracapacitor modules being adapted for pluggable connection with the connection module and for slidable insertion in the frame,
   wherein each ultracapacitor module includes a connector that slides into a respective counterpart connector located on the connection module for power connection and signal transmission between the ultracapacitor modules.

2. The coupling system according to claim 1, wherein the connection module includes electronics needed for the connection of power and signals between the ultracapacitor modules.

3. The coupling system according to claim 1, comprising a heat sink on the housing with means for airflow over the heat sink.

4. The coupling system of claim 3, wherein an air-guiding plate is provided on the side of the heat sink remote from the housing.

5. The coupling system of claim 4, wherein the air-guiding plate is adapted for sliding into the frame or is mounted onto an ultracapacitor module.

6. The coupling system of claim 1 wherein the ultracapacitors in an ultracapacitor module are connected in series.

7. The coupling system of claim 6, wherein the ultracapacitors in an ultracapacitor module are connected by busbars.

8. The coupling system of claim 7, wherein the busbars are in conductive thermal contact with an outer material of the housing in which the ultracapacitors are located.

9. The coupling system of claim 1, further comprising a controller, the controller being adapted for voltage monitoring and/or isolation fault detection.

10. The coupling system of claim 1, further comprising a pressure compensation element integrated into the housing for providing an equal pressure inside and outside each of the ultracapacitor modules.

11. A vehicle having an energy storage system including a coupling system for the plurality of ultracapacitor modules according to claim 1.

* * * * *